United States Patent [19]
Jung et al.

[11] Patent Number: 6,132,926
[45] Date of Patent: Oct. 17, 2000

[54] ARF PHOTORESIST COPOLYMERS

[75] Inventors: Jae Chang Jung; Cheol Kyu Bok; Ki Ho Baik, all of Kyoungki-do, Rep. of Korea

[73] Assignee: Hyundai Electronics Industries Co., Ltd., Rep. of Korea

[21] Appl. No.: 09/000,984

[22] Filed: Dec. 30, 1997

[30] Foreign Application Priority Data

Dec. 31, 1996 [KR] Rep. of Korea ............ 96-80264
Jun. 21, 1997 [KR] Rep. of Korea ............ 97-26807

[51] Int. Cl.$^7$ ................................................. C08F 232/00
[52] U.S. Cl. ................. 430/270.1; 526/269; 526/272; 526/281
[58] Field of Search ............ 430/270.1; 526/269, 526/271, 272, 281

[56] References Cited

U.S. PATENT DOCUMENTS

| | | | |
|---|---|---|---|
| 3,715,330 | 2/1973 | Nogami et al. | 260/40 |
| 4,011,386 | 3/1977 | Matsumoto et al. | . |
| 4,106,943 | 8/1978 | Ikeda et al. | . |
| 4,491,628 | 1/1985 | Ito et al. | 430/176 |
| 4,883,740 | 11/1989 | Schwalm et al. | 430/270 |
| 5,087,677 | 2/1992 | Brekner et al. | 526/160 |
| 5,212,043 | 5/1993 | Yamamoto et al. | . |
| 5,252,427 | 10/1993 | Bauer et al. | 430/270 |
| 5,278,214 | 1/1994 | Moriya et al. | . |
| 6,028,153 | 2/2000 | Jung | 526/258 |

FOREIGN PATENT DOCUMENTS

| | | |
|---|---|---|
| 794458 | 9/1997 | European Pat. Off. . |
| 0836119A1 | 11/1997 | European Pat. Off. . |
| 1329997 | 9/1970 | United Kingdom . |
| WO 96/37526 | 11/1996 | WIPO . |
| WO 97/33198 | 9/1997 | WIPO . |

OTHER PUBLICATIONS

Jung et al., "Synthesis and Characterization of Alicyclic Polymers with Hydrophilic Groups for 193 nm Single Layer Resist", 1999, CA Abstract 130:229879.
Uzodinma Okoroanyanwu et al., "New Single Layer Positive Photoresists for 193 nm Photolithography," SPIE, vol. 3049, 1997, pp. 92–103.
D. Braun et al., "Über Die Copolymerization Von Maleinsäure–Anhydrid Mit Bicyclo[2.2.1]Hept–5–En–2–Carbonsäure," Eur. Polym. J., vol. 10, 1974, pp. 357–365.
CA vol. 66 (1967), 76325, pp. 7178–7179.
CA Register No. 100207–98–5.
CA Register No. 32759–57–2.
CA Register No. 27056–70–8.
CA Register No. 174659–58–6.
CA Register No. 28503–41–5.
CA Register No. 194997–59–6.
CA Abstract No. 104:149512 & Macromolecules 19(4) 1266–8 (1986).
CA Abstract No. 91:124064 & Makromol. Chem. 180(8) 1975–88 (1979).
CA Abstract No. 113:24734 & JP 02 051511.
CA Abstract No. 124:317926 & Marcomol. Rapid Commun. 17(3) 173–180 (1996).
CA Abstract No. 124:203171 & Macromolecules 29(8) 2755–63 (1996).
CA Abstract No. 199328–07–9.
R.D. Allen et. al., "The Influence of Photoacid Structure on the Design and Performance of 193nm Resists", 1997, Journal of Photopolymer Science and Technology, vol. 10, 503–510.
F.M. Houlihan et. al., "A Commerically Viable 193nm Single Layer Resist Platform", 1997, Journal of Photopolymer Science and Technology, vol. 10, 511–520.
J.C. Jung et. al., "ArF Single Layer Resist Composed of Alicyclic Main Chain Containing Maleic Anhydride", 1997, Journal of Photopolymer Science and Technology, vol. 10, 529–533.
S.J. Choi et. al., "New ArF Single–layer Resist for 193–nm Lithography", 1997, Journal of Polymer Science and Technology, vol. 10, 521–528.
K. Nozaki and Ei Yaro, "New Protective Groups in Methacrylate Polymer for 193–nm Resists", 1997, Journal of Photopolymer Science and Technology, vol. 10, 545–550.
K. Nakano et. al., "Chemically Amplified Resist Based on High Etch–Resistant Polymer for 193–nm Lithography", 1997, Journal of Photopolymer Science and Technology, vol. 10, 561–569.
T.I. Wallow et al., "Evaluation of Cyclo–Olefin–Maleic Anhydride Alternating Copolymers as Single–Layer Photo–Resists for 193 NM Photo–Lithography" SPIE vol. 2724/354—365.
CA Abstract 127;227308 & Proc. SPIE–Int. Soc. Opt. Eng. (1997) 3049 Advances in Resist Technology and Processing XIV 92–103.
CA Abstract 127;227269 & J. Photopolym. Sci. Technol. (1997) 10(4) 529–534.
CA Abstract 66;18889 & Magy. Kem. Foly. (1966) 72(11)491–3.

*Primary Examiner*—Janet Baxter
*Assistant Examiner*—Barbara Gilmore
*Attorney, Agent, or Firm*—Townsend and Townsend and Crew LLP

[57] ABSTRACT

A photoresist including a copolymer prepared from bicycloalkene derivative, maleic anhydride and/or vinylene carbonate, which has molecular weight ranging from about 3,000 to 100,000. The photoresist can be used for submicrolithography employing deep ultra violety as a light source. In addition to being of high etch resistance and thermal resistance, the photoresist has good adhesiveness and can be developed in a TMAH solution.

40 Claims, No Drawings

ARF PHOTORESIST COPOLYMERS

BACKGROUND OF THE INVENTION

1. Field of the Invention

The present invention relates to the fabricating integrated circuit. More particularly, the invention provides an ArF photoresist resin and a preparation method therefor and, more particularly, to a photoresist copolymer suitable for submicrolithography using deep ultra violet (DUV) light as a light source and a method for preparing such a copolymer. Also, the present invention provides a photoresist including such a resin.

2. Description of the Prior Art

Recently, chemical amplification photoresists have been prevailing in semiconductor devices since they were found to be highly sensitive to DUV light, which is recognized as a light source suitable for accomplishing the high integration of semiconductor devices. A chemical amplification photoresist has generally a photoacid generator and a matrix polymer having such a chemical structure which sensitively reacts with acid.

As for the action mechanism of such a photoresist, when the photoresist is exposed through a mask to a DUV light source, protons are generated by the action of the photoacid generator and then, react with the main or side chain of the matrix polymer. This reaction increases the solubility of the copolymer in a developing solution by converting the structure of the copolymer, e.g., by decomposing it, cross-linking it or changing its polarity. Therefore, when being treated with the developing solution, the copolymer is dissolved at exposed regions whereas it remains undissolved at un-exposed regions, thereby leaving the shape of the mask as a positive image on a substrate. Meanwhile, the resolution of the patterns formed by photolithography is generally proportional to the wavelength of light source. Thus, finer patterns can be formed as the wavelength is shorter. As a result of the effort to find new light sources suitable to improve the resolution, deep uv (DUV) light was developed for the integration of semiconductor devices into 1 giga or higher scale.

Generally, photoresists are required to be of high etch resistance and thermal resistance. In addition, the photoresist to be used for ArF should be developed in a 2.38% tetramethylammonium hydroxide (TMAH) solution. However, in fact, it is difficult to obtain a photoresist resin which satisfies those properties entirely.

For example, the resins having a backbone of poly (methylmethaacrylate), which is transparent to the light of the above short wavelengths, are easy to synthesize. But there are problems in practical application owing to their poor etch resistance and development in TMAH solution. Etch resistance can be improved by introducing aliphatic rings monomers into the main chain. But it is virtually impossible to synthesize the resin having a main chain consisting of aliphatic rings.

In order to solve the above problems, AT&T (or Bell Laboratory) developed a resin having a main chain which is substituted for norbornene, acrylate and maleic anhydride, represented by the following formula I:

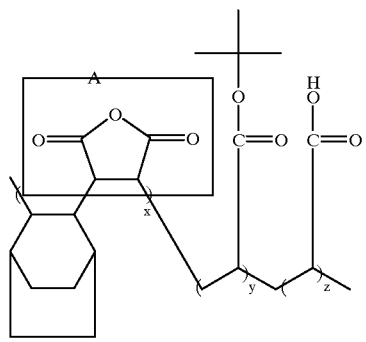

In Formula I, the maleic anhydride part A is used with the aim of polymerizing aliphatic cyclo-olefin groups but well dissolved in a 2.38% TMAH solution even in the state of un-exposure. This dissolution can be inhibited by increasing the proportion of the y part, substituted for t-butyl, in the main chain. If so, the z part, functioning to increase the adhesiveness to a substrate, relatively becomes small in proportion, which leads to the release of the photoresist from the substrate, e.g. wafer. As a result, the formation of good patterns is impossible by this method. Bell Laboratory suggested a two-component system including a cholesterol compound as a dissolution inhibitor. This dissolution inhibitor is, however, required to be added in a large quantity, for example, about 30% by weight of the resin, so that Bell Laboratory's resins are in principle problematic in use for photoresist resin.

SUMMARY OF THE INVENTION

Therefore, it is an object of the present invention to overcome the above problems encountered in prior arts and to provide an ArF photoresist resin which is little dissolved in developing solutions without a chemical change in its structure in addition to being superior in etch resistance, thermal resistance and adhesiveness.

It is an object of the present invention to provide a photoresist copolymer.

It is another object of the present invention to provide a method for preparing the photoresist copolymer.

It is a further object of the present invention to provide a photoresist comprising the photoresist copolymer.

It is still another object of the present invention to provide a method for fabricating the photoresist.

It is still another object of the present invention to provide a method for fabricating an integrated circuit device.

It is still another object of the present invention to provide a partially completely semiconductor device.

DETAILED DESCRIPTION OF THE INVENTION

The novel photoresist copolymer of the present invention is prepared from one or more bicycloalkene compounds of the following formula II, maleic anhydride of the following formula III and/or vinylene carbonate of the following formula IV:

[FORMULA II]

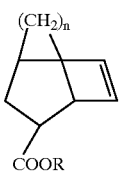

wherein, R represents hydrogen or a straight or branched alkyl containing 1–10 substituted or non-substituted carbon atoms; and n is 1 or 2,

[FORMULA III]

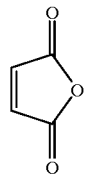

[FORMULA IV]

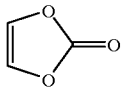

In Formula II, preferred R group is selected from the group including hydrogen, 2-hydroxyethyl and t-butyl. That is, preferred examples of the bicyclicalkene include 2-hydroxyethyl 5-norbornene-2-carboxylate, t-butyl 5-norbornene-2-carboxylate, 5-norbornene 2-carboxylic acid, 2-hydroxyethyl bicyclo [2,2,2]oct-5-ene-2-carboxylate, t-butyl bicyclo[2,2,2]oct-5-ene-2-carboxylate and/or bicyclo[2,2,2]oct-5-ene-2-carboxylic acid.

The copolymer of the invention has a molecular weight ranging from approximately 3,000 to 100,000.

One of the preferable copolymers of the invention is prepared from vinylene carbonate and one or more bicyclic alkenes wherein R is hydrogen, 2-hydroxy ethyl and t-butyl and n is 1. That is, it is selected from 2-hydroxyethyl 5-norbornene-2-carboxylate, t-butyl 5-norbornene-2-carboxylate, 5-norbornene 2-carboxylic acid.

The novel copolymers of the present invention, consisting of one or more the bicycloalkene compound of Formula II, and maleic anhydride of Formula III or vinylene carbonate of Formula IV, may be prepared according to ordinary radical polymerization techniques using radical polymerization initiators.

They are polymerized in bulk polymerization or in a solution polymerization. For polymerization solvent, cyclohexanone, methylethylketone, benzene, toluene, dioxane, dimethylformamide, tetrahydrofuran alone or the combinations thereof may be used. Usually, the polymerization is carried out in the presence of a polymerization initiator, such as benzoylperoxide, 2,2'-azobisisobutyronitrile (AIBN), acetyl peroxide, lauryl peroxide and t-butylperacetate.

A positive photoresist composition useful for forming positive fine patterns in semiconductor devices may be obtained by mixing the novel photoresist copolymer of the invention with a photoacid generator in an organic solvent in a typical manner. Upon formulation, the amount of the copolymer is dependent on the organic solvent, the photoacid generator and the lithography conditions and is preferably about 10–30% by weight of the organic solvent used.

To fabricating a photoresist, the copolymer of the invention is first dissolved in cyclohexanone or at an amount of 10–30% by weight and an onium salt or organic sulfonic acid, as a photoacid generator, is added at an amount of about 0.1–10% by weight of the resist polymer. Then, this solution is filtered with an ultrafine filter to yield a photoresist solution.

This photoresist solution is spin-coated on a silicon wafer which is, then, soft-baked at a temperature of 80–150° C. for 1–5 min in an oven or on a hot plate. An exposure process is carried out by use of a stepper which employs deep uv light or excimer laser as a light source. Thereafter, the wafer is subjected to post-baking at a temperature of 100–200° C. An ultrafine positive resist image can be obtained by immersing the post-baked wafer for 90 seconds in a 2.38% TMAH solution.

A better understanding of the present invention may be obtained in light of following examples which are set forth to illustrate, but are not to be construed to limit, the present invention.

EXAMPLE I

Synthesis of 2-hydroxyethyl 5-norbornene-2-carboxylate

Dicyclopentadiene of the following formula V was cracked at about 120–170° C., thereby obtaining cyclopentadiene of the wing formula VI

[FORMULA V]

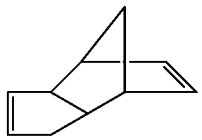

[FORMULA VI]

Cyclopentadiene of Formula VI and 2-hydroxyethylacrylate of the following formula VII were dissolved at a same rate in ether or tetrahydrofuran. Thereafter, this was reacted at a temperature of about −30 to 60° C. for 24 hours. Thereafter, the solvent was removed by use of a rotary evaporator and the residues were distilled in vacuo to give 2-hydroxyethyl 5-norbornene-2-carboxylate of the following formula VIII which was in an endo- and exo-mixture.

[FORMULA VII]

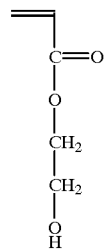

[FORMULA VIII]

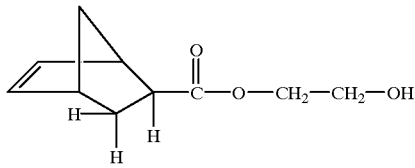

EXAMPLE II

Synthesis of t-butyl 5-norbornene-2-carboxylate

In a reactor, 66 g of cyclopentadiene was first put and then mixed with 500 g of tetrahydrofuran. To the reactor, 128 g of t-butyl acrylate was added. Thereafter, these reactants were subjected to a reaction at a temperature of −30 to 60° C. for 10 hrs with stirring. After the completion of the reaction, the solvent was vaporized in vacuo by use of a rotary evaporator then vacuum distilled to produce the title compound: yield is 90%.

EXAMPLE III

Synthesis of Copolymer 91 g of the 2-hydroxyethyl 5-norbornene-2-carboxylate synthesized in Example I, 97 g of the t-butyl 5-norbornene-2-carboxylate synthesized in Example II, and 86 g of vinylene carbonate were put in a reactor and solvent was poured therein. Then, a polymerization initiator was added to the reactor and the reactor was purged with a C under a pressure of 50–200 atm. After the completion of the reaction, a part of the solvent was removed by a rotary evaporator and residue of the solvent was precipitated in ethyl ether. The precipitate was filtered and dried in a vacuum oven. The resulting product was used as a photoresist resin.

EXAMPLE IV

Synthesis of Copolymer 91 g of the 2-hydroxyethyl 5-norbornene-2-carboxylate synthesized in Example I, 97 g of the t-butyl 5-norbornene-2-carboxylate synthesized in Example II, and 98 g of maleic anhydride were put in a reactor and solvent was poured therein. Then, a polymerization initiator was added to the reactor and the reactor was purged with a nitrogen atmosphere. A reaction was performed for 6 hrs at 65–120° C. After the completion of the reaction, a part of the solvent was removed by a rotary evaporator and residue of the solvent was precipitated in ethyl ether. The precipitate was filtered and dried in a vacuum oven. The resulting product was used as a photoresist resin.

EXAMPLE V

Synthesis of Copolymer 98 g of bicyclo [2,2,2] oct-5-ene-2-hydroxyethyl, 104 g of bicyclo [2,2,2]oct-5-ene-t-butylacrylate and 86 g of vinylene carbonate were put into a reactor and then, mixed with 2 L of tetrahydrofuran solvent. Thereafter, 1.5 g of azobisisobutyronitrile(AIBN) was put into the reactor and then, the reactor was purged with a nitrogen atmosphere. A reaction was performed for 6 hrs at 65° C. After the completion of the reaction, a part of the solvent was removed by a rotary evaporator and residue of the solvent was precipitated in ethyl ether. The precipitate was filtered and dried in a vaccum oven. The resulting product was used as a photoresist resin.

EXAMPLE VI

Synthesis of Copolymer 98 g of bicyclo [2,2,2] oct-5-ene-2-hydroxyethyl, 104 g of bicyclo [2,2,2] oct-5-ene-t-butylacrylate and 86 g of maleic anhydride were put into a reactor and then, mixed with 2 L of tetrahydrofuran solvent. Thereafter, 1.5 g of azobisisobutyronitrile(AIBN) was put into the reactor and then, the reactor was purged with a nitrogen atmosphere. A reaction was performed for 6 hrs at 65° C. After the completion of the reaction, a part of the solvent was removed by a rotary evaporator and residue of the solvent was precipitated in ethyl ether. The precipitate was filtered and dried in a vaccum oven. The resulting product was used as a photoresist resin.

EXAMPLE VII

Synthesis of ArF Photoresist Resin

Synthesis of poly[2-hydroxyethyl 5-norbornene-2-carboxylate/t-butyl 5-norbornene-2-carboxylate/5-norbornene 2-carboxylic acid/maleic anhydride]

1 mole of maleic anhydride, 0.05–0.8 moles of 2-hydroxyethyl 5-norbornene-2-carboxylate, 0.5–0.95 moles of t-butyl 5-norbornene-2-carboxylate and 0.01 to 0.2 moles of 5-norbornene 2-carboxylic acid (structures of which are shown in formula IX below) were dissolved in tetrahydrofuran or toluene. Thereafter, it was dissolved in a solvent. A radical reaction was executed at a temperature of about 60–70° C. for 4–24 hours under a nitrogen or argon atmosphere in the presence of 0.5–10 g of azobisisobutyronitrile (AIBN), as an initiator. The resin thus produced by this polymerization was precipitated in ethyl ether or hexane and dried to yield poly[2-hydroxyethyl 5-norbornene-2-carboxylate/t-butyl 5-norbornene-2-carboxylate/5-norbornene 2-carboxylic acid/maleic anhydride] resin of the following formula X.

[FORMULA IX]

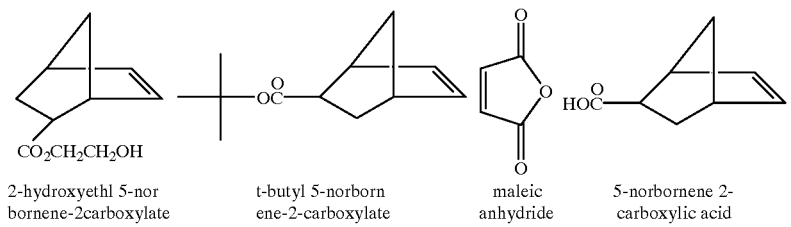

| 2-hydroxyethl 5-nor bornene-2carboxylate | t-butyl 5-norborn ene-2-carboxylate | maleic anhydride | 5-norbornene 2-carboxylic acid |

[FORMULA X]

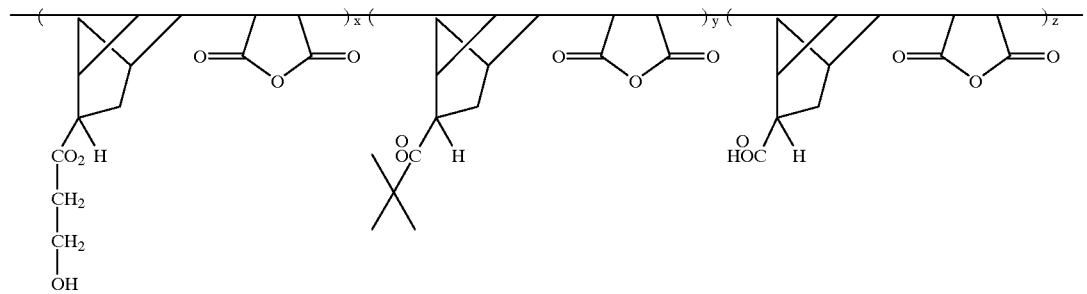

EXAMPLE VIII

Preparation of Photoresist Film and Formation of Pattern 10 g of poly[2-hydroxyethyl 5-norbornene-2-carboxylate/ t-butyl 5-norbornene-2-carboxylate/5-norbornene 2-carboxylic acid/maleic anhydride] were dissolved in 40 g of 3-methoxymethyl propionate solvent and added with about 0.02–1 g of triphenyl sulfonium triflate or dibutyl-naphthyl sulfonium trif late or mixture of these two photo-acid generator. After being well stirred, the mixture passed through a 0.10 μm filter. This filtrate was coated on a wafer and patterned. When the coat was about 0.6 μm thick, a vertical L/S pattern was obtained with a resolution of 0.14 μm.

As described hereinbefore, the photoresist prepared from the novel copolymer of the invention is superior in etch resistance and thermal resistance. In addition, it can be developed in a 2.38% TMAH solution. It also shows such good adhesiveness that 0.15 μm L/S patterns with satisfactory resolution and depth of focus can be obtained from the photoresist coat 0.7 μm thick. Consequently, the introduction of, for example, 2-hydroxyethyl 5-norbornene-2-carboxylate into the backbone of a resin allows for a synthesis of photoresist excellent in adhesiveness.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A photoresist copolymer which is polymerized from one or more carboxy-substituted bicycloalkenes of the following formula II, and maleic anhydride of the following formula III or a vinylene carbonate of the following formula IV:

(FORMULA II)

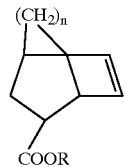

wherein R represents hydrogen or a straight or branched alkyl containing 1–10 substituted or non-substituted carbon atoms, R of one of said bicycloalkenes being hydroxyalkyl; and n is 1 or 2

(FORMULA III)

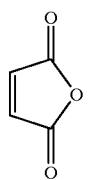

(FORMULA IV)

2. A photoresist copolymer in accordance with claim 1, wherein one of said bicycloalkenes is selected from the group consisting of 2-hydroxyethyl 5-norbornene-2-carboxylate and 2-hydroxyethyl bicyclo (2,2,2) oct-5-ene-2-carboxylate, and the remaining bicycloalkenes are selected from the group consisting of t-butyl 5-norbornene-2-carboxylate, 5-norbornene 2-carboxylic acid, t-butyl bicyclo (2,2,2) oct-5-ene-2-carboxylate and bicyclo (2,2,2) oct-5-ene-2-carboxylic acid.

3. A photoresist copolymer in accordance with claim 1 comprising:

(i) as a first bicycloalkene, a compound of formula II wherein R is alkyl;

(ii) as a second bicycloalkene, a compound of formula II wherein R is hydroxyalkyl; and (iii) as a third bicycloalkene, a compound of formula II wherein R is hydrogen.

4. A photoresist copolymer in accordance with claim 3, wherein said copolymer is polymerized from vinylene carbonate and said bicycloalkenes wherein R of said first bicycloalkene is t-butyl, R of said second bicycloalkene is 2-hydroxyethyl and R of said third bicycloalkene is hydrogen, and n is 1.

5. A photoresist copolymer in accordance with claim 3 wherein said copolymer is polymerized from maleic anhydride and said bicycloalkenes wherein said first bicycloalkene is t-butyl 5-norbornene-2-carboxylate or t-butyl bicyclo (2,2,2) oct-5-ene-2-carboxylate; said second bicycloalkene is 2-hydroxyethyl 5-norbornene-2-carboxylate or 2-hydroxyethyl bicyclo (2,2,2) oct-5-ene-2-carboxylate; and said third bicycloalkene is 5-norbornene 2-carboxylic acid or bicyclo (2,2,2) oct-5-ene-2-carboxylic acid.

6. A photoresist copolymer in accordance with claim 1, wherein said copolymer ranges, in molecular weight, from about 3,000 to 100,000.

7. A photoresist copolymer in accordance with claim 1, wherein said copolymer comprises:

1) as a first comonomer, at least one of 2-hydroxyethyl 5-norbornene-2-carboxylate and 2-hydroxyethyl biclyclo (2,2,2) oct-5-ene-2-carboxylate; and 2) as a second comonomer, at least one of maleic anhydride and vinylene carbonate.

8. A photoresist copolymer in accordance with claim 1, wherein said copolymer is poly(2-hydroxyethyl 5-norbornene-2-carboxylate/t-butyl 5-norbornene-2-carboxylate/5-norbornene 2-carboxylic acid/maleic anhydride).

9. A photoresist copolymer in accordance with claim 1, wherein said copolymer is poly(2-hydroxyethyl 5-norbornene-2-carboxylate/t-butyl 5-norbornene-2-carboxylate/5-norbornene 2-carboxylic acid/vinylene carbonate).

10. A photoresist, which comprises a copolymer having repeating units derived from one or more carboxy-substituted bicycloalkenes of the following formula II, and maleic anhydride of the following formula III or vinylene carbonate of the following formula IV:

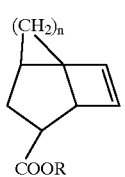

(FORMULA II)

wherein R represents hydrogen or a straight or branched alkyl containing 1–10 substituted or non-substituted carbon atoms, R of one of said bicycloalkenes being hydroxalkyl; and n is 1 or 2,

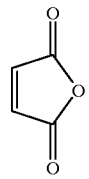

(FORMULA III)

(FORMULA IV)

11. A photoresist in accordance with claim 10, wherein one of said bicycloalkenes is selected from the group consisting of 2-hydroxyethyl 5-norbornene-2-carboxylate and 2-hydroxyethyl bicyclo (2,2,2) oct-5-ene-2-carboxylate, and the remaining bicycloalkenes are selected from the group consisting of t-butyl 5-norbornene-2-carboxylate, 5-norbornene 2-carboxylic acid, t-butyl bicyclo (2,2,2) oct-5-ene-2-carboxylate and bicyclo (2,2,2) oct-5-ene-2-carboxylic acid.

12. A photoresist in accordance with claim 10 comprising:

(i) as a first bicycloalkene, a compound of formula II wherein R is alkyl;

(ii) as a second bicycloalkene, a compound of formula II wherein R is hydroxyalkyl; and (iii) as a third bicycloalkene, a compound of formula II wherein R is hydrogen.

13. A photoresist in accordance with claim 12, wherein said copolymer comprises repeating units from vinylene carbonate and said bicycloalkenes wherein R of said first bicycloalkene is t-butyl, R of said second bicycloalkene is 2-hydroxyethyl and R of said third bicycloalkene is hydrogen, and n is 1.

14. A photoresist in accordance with claim 12 wherein said copolymer comprises repeating units from maleic anhydride and said bicycloalkenes wherein said first bicycloalkene is t-butyl 5-norbornene-2-carboxylate or t-butyl bicyclo (2,2,2) oct-5-ene-2-carboxylate; said second bicycloalkene is 2-hydroxyethyl 5-norbornene-2-carboxylate or 2-hydroxyethyl bicyclo (2,2,2) oct-5-ene-2-carboxylate; and said third bicycloalkene is 5-norbornene 2-carboxylic acid or bicyclo (2,2,2) oct-5-ene-2-carboxylic acid.

15. A photoresist in accordance with claim 10, wherein said copolymer ranges, in molecular weight, from about 3,000 to 100,000.

16. A photoresist copolymer which comprises 2-hydroxyethyl 5-norbornene-2-carboxylate polymerized with the following monomers:

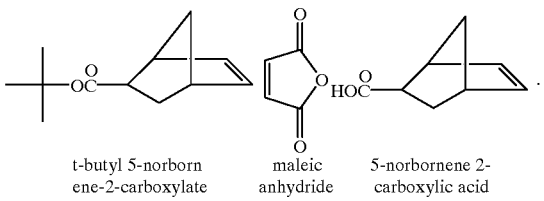

t-butyl 5-norbornene-2-carboxylate    maleic anhydride    5-norbornene 2-carboxylic acid 17. A photoresist copolymer in accordance with claim 16, wherein said copolymer comprises poly(2-hydroxyethyl 5-norbornene-2-carboxylate/t-butyl 5-norbornene-2-carboxylate/5-norbornene 2-carboxylic acid/maleic anhydride) of the following formula X:

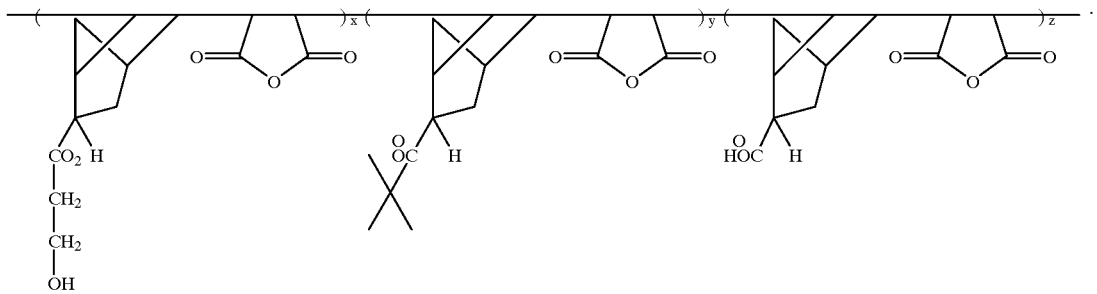

18. A semiconductor device comprising:
   a substrate; and
   a film comprising a photoresist copolymer which is polymerized from one or more carboxy-substituted bicycloalkenes of the following formula II, and maleic anhydride of the following formula III or vinylene carbonate of the following formula IV, said film overlying said substrate

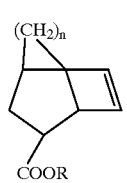
(FORMULA II)

wherein R represents hydrogen or a straight or branched alkyl containing 1–10 substituted or non-substituted carbon atoms, R of one of said bicycloalkenes being hydroxyalkyl; and n is 1 or 2

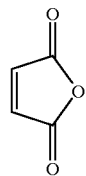
(FORMULA III)

(FORMULA IV)

19. A semiconductor device in accordance with claim 18, wherein one of said bicycloalkenes is selected from the group consisting of 2-hydroxyethyl 5-norbornene-2-carboxylate and 2-hydroxyethyl bicyclo (2,2,2) oct-5-ene-2-carboxylate, and the remaining bicycloalkenes are selected from the group consisting of t-butyl 5-norbornene-2-carboxylate, 5-norbornene 2-carboxylic acid, t-butyl bicyclo (2,2,2) oct-5-ene-2-carboxylate and bicyclo (2,2,2) oct-5-ene-2-carboxylic acid.

20. A semiconductor device in accordance with claim 18 comprising:
   (i) as a first bicycloalkene, a compound of formula II wherein R is alkyl;
   (ii) as a second bicycloalkene, a compound of formula II wherein R is hydroxyalkyl; and
   (iii) as a third bicycloalkene, a compound of formula II wherein R is hydrogen.

21. A semiconductor device in accordance with claim 20, wherein said photoresist copolymer is polymerized from vinylene carbonate and said bicycloalkenes wherein R of said first bicycloalkene is t-butyl, R of said second bicycloalkene is 2-hydroxyethyl and R of said third bicycloalkene is hydrogen, and n is 1.

22. A semiconductor device in accordance with claim 20 wherein said copolymer is polymerized from maleic anhydride and said bicycloalkenes wherein said first bicycloalkene is t-butyl 5-norbornene-2-carboxylate or t-butyl bicyclo (2,2,2) oct-5-ene-2-carboxylate; said second bicycloalkene is 2-hydroxyethyl 5-norbornene-2-carboxylate or 2-hydroxyethyl bicyclo (2,2,2) oct-5-ene-2-carboxylate; and said third bicycloalkene is 5-norbornene 2-carboxylic acid or bicyclo (2,2,2) oct-5-ene-2-carboxylic acid.

23. A semiconductor device in accordance with claim 18, wherein said copolymer ranges, in molecular weight, from about 3,000 to 100,000.

24. A method for preparing a photoresist copolymer in accordance with claim 1 which comprises copolymerizing one or more bicycloalkenes of formula II with maleic anhydride or vinylene carbonate.

25. A method for preparing a photoresist copolymer in accordance with claim 24, wherein one of said bicycloalkenes is 2-hydroxyethyl 5-norbornene-2-carboxylate or 2-hydroxyethyl bicyclo [2,2,2]oct-5-ene-2-carboxylate, and the remaining bicycloalkene(s) are selected from the group consisting of t-butyl 5-norbornene-2-carboxylate, 5-norbornene 2- carboxylic acid, t-butyl bicyclo[2,2,2]oct-5-ene-2carboxylate and bicyclo[2,2,2]oct-5-ene-2- carboxylic acid.

26. A method for preparing a photoresist copolymer in accordance with claim 24, wherein R of formula II is hydrogen, 2-hydroxyethyl, or t-butyl.

27. A method for preparing a photoresist copolymer in accordance with claim 24, wherein said copolymer is polymerized to a molecular weight of from about 3,000 to 100,000.

28. A method for preparing a photoresist copolymer in accordance with claim 24, wherein said bicycloalkene(s) and maleic anhydride or vinylene carbonate are copolymerized using radical polymerization initiators.

29. A method for preparing a photoresist copolymer in accordance with claim 28, wherein said radical polymerization initiators are selected from the group consisting of benzoylperoxide; 2,2'-azobisisobutyronitrile; acetylperoxide; lauryl peroxide and t- butylperacetate.

30. A method for preparing a photoresist copolymer in accordance with claim 24, wherein said bicycloalkene(s) and maleic anhydride or vinylene carbonate are copolymerized by using bulk polymerization or solution polymerization in a suitable polymerization solvent.

31. A method for preparing a photoresist copolymer in accordance with claim 30, wherein said polymerization solvent is selected from the group consisting of cyclohexanone, methylethylketone, benzene, toluene, dioxane, dimethylformamide, tetrahydrofuran and combinations thereof.

32. A process for preparing a photoresist copolymer in accordance with claim 1 which comprises:
   (i) dissolving 1 mole of maleic anhydride, 0.05 to 0.08 moles of a 2- hydroxyethyl 5-nirbornene-2-carboxylate, 0.5 to 0.95 moles of t-butyl 5-norbornene-2- carboxylate and 0.01 to 0.2 moles of 5norbornene-2-carboxylic acid in tetrahydrofuran or toluene solvent;
   (ii) adding 0.5 to 1.0 g of azobisisobutyronitrile polymerization initiator to the solution of step (i);
   (iii) reacting the solution of step (ii) for 4 to 24 hours at 65° to 70° C under a nitrogen or argon atmosphere; and
   (iv) precipitating and drying the reaction product of step (ii) to produce poly (2-hydroxyethyl 5-norbornene-2-carboxylate/t-butyl 5-norbornene-2-carboxylate/5-norbornene-2-carboxylate/maleic anhydride) photoresist copolymer.

33. A method for preparing a photoresist which comprises the steps of mixing a copolymer of claim 1 and a sensitizer in an organic solvent, to produce a photoresist solution.

34. A method for preparing a photoresist in accordance with claim 33, wherein one of the bicycloalkenes of said copolymer is selected from the group consisting of 2-hydroxyethyl 5-norbornene-2-carboxylate and 2-hydroxyethyl bicyclo[2,2,2]oct-5-ene-2- carboxylate, and the remaining bicycloalkenes are selected from the group consisting of t-butyl 5-norbornene-2-carboxylate, 5-norbornene 2-carboxylic acid, t-butyl bicyclo [2,2,2]oct-5-ene- 2-carboxylate and bicyclo[2,2,2]oct-5-ene-2-carboxylic acid.

35. A method for preparing a photoresist in accordance with claim 33, wherein R of formula II is hydrogen, 2-hydroxyethyl, or t-butyl.

36. A method for preparing a photoresist in accordance with claim 33, wherein said copolymer ranges, in molecular weight, from about 3,000 to 100,000.

37. A method for preparing a photoresist in accordance with claim 33, wherein said organic solvent is cyclohexanone or 3-methoxymethyl propionate.

38. A method for preparing a photoresist in accordance with claim 33, wherein said sensitizer comprises a photoacid generator which is selected from the group consisting of an onium salt or organic sulfonic acid.

39. A method for preparing a photoresist according to claim 33 which comprises:
   (i) dissolving 9 to 11 g of poly (2-hydroxyethyl 5-norbornene-2- carboxylate/t-butyl 5-norbornene-2-carboxylate/5-norbornene-2-carboxylate/maleic anhydride) copolymer resin in 39 to 42 g of methyl 3-methoxypropionate solvent;
   (ii) adding 0.02 to 1 g of triphenyl sulfonium triflate or dibutylnaphthyl sulfonium triflate, or a mixture thereof, to the solution resulting from step (i); and
   (iii) stirring filtering the reaction product of step (ii) to produce a photoresist.

40. A method of fabricating a semiconductor device in accordance with claim 18, said method comprising:
   applying said film of resist on said substrate;
   exposing a portion of the film of resist using electromagnetic radiation;
   developing said film of resist to form a pattern on said substrate corresponding to said portion of said exposed film; and
   forming a semi-conductor device from said patterned substrate.

* * * * *

UNITED STATES PATENT AND TRADEMARK OFFICE
CERTIFICATE OF CORRECTION

PATENT NO. : 6,132,926  
DATED : October 17, 2000  
INVENTOR(S) : Jae Chang Jung, Cheol Kyu Bok and Ki Ho Baik It is certified that error appears in the above-identified patent and that said Letters Patent is hereby corrected as shown below:

Column 5,
Line 30, the phrase reading "to the reactor and the the reactor was purged with a C under a pressure of 50-200 atm." should read -- to the reactor and the reactor was purged with a nitrogen atomosphere. A reaction was performed for 6 hrs at 65-120 C under a pressure of 50-200 atm. --.

Signed and Sealed this

Twenty-first Day of January, 2003

JAMES E. ROGAN
*Director of the United States Patent and Trademark Office*